United States Patent
Chow et al.

(10) Patent No.: US 6,787,816 B1
(45) Date of Patent: Sep. 7, 2004

(54) THYRISTOR HAVING ONE OR MORE DOPED LAYERS

(75) Inventors: Tatsing P. Chow, Niskayuna, NY (US); Jeffrey B. Fedison, Niskayuna, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 09/944,522

(22) Filed: Aug. 31, 2001

Related U.S. Application Data
(60) Provisional application No. 60/229,863, filed on Sep. 1, 2000.

(51) Int. Cl.⁷ .................. H01L 29/68; H01L 21/332
(52) U.S. Cl. ............................. 257/170; 438/133
(58) Field of Search ............................ 438/133–140; 257/170

(56) References Cited

U.S. PATENT DOCUMENTS

| | | | |
|---|---|---|---|
| 4,151,011 A | * 4/1979 | Mihashi et al. | 148/1.5 |
| 4,278,476 A | * 7/1981 | Bartko et al. | 148/1.5 |
| 5,087,576 A | * 2/1992 | Edmond et al. | 437/22 |
| 5,443,999 A | * 8/1995 | Uenishi et al. | 437/6 |
| 5,539,217 A | * 7/1996 | Edmond et al. | 257/77 |
| 5,835,985 A | * 11/1998 | Hiyoshi et al. | 257/121 |
| 5,936,267 A | * 8/1999 | Iwamuro | 257/147 |

* cited by examiner

*Primary Examiner*—John F. Niebling
*Assistant Examiner*—Viktor Simkovic
(74) *Attorney, Agent, or Firm*—Lowrie, Lando & Anastasi, LLP

(57) ABSTRACT

A method is provided for forming one or more doped layers using ion-implantation in the fabrication of thyristor devices. For example, these thyristors may be made from single crystalline silicon carbide. According to one aspect of the invention, one of the required layers is formed by introducing dopants after crystal growth as opposed to conventional methods which involve doping during crystal growth. Specifically, impurities may be introduced by using the technique of ion implantation.

14 Claims, 4 Drawing Sheets

THYRISTOR HAVING ONE OR MORE DOPED LAYERS

RELATED APPLICATIONS

This application claims the benefit under Title 35 U.S.C. §119(e) of co-pending U.S. Provisional Application Serial No. 60/229,863, filed Sep. 1, 2000, entitled "THYRISTOR HAVING ONE OR MORE DOPED LAYERS" by Tatsing Paul Chow and Jeffrey Bernard Fedison, the contents of the aforementioned applications are incorporated herein by reference.

BACKGROUND OF THE INVENTION

1. Field of the Invention

The field of the invention relates generally to the manufacturing of semiconductor devices, and more specifically to the manufacturing of thyristors.

2. Discussion of the Related Art

Conventional methods for fabricating silicon carbide thyristors and gate turn-off thyristors include utilizing an all-epitaxial growth technique to fabricate each layer of the device. This epitaxial growth involves doping the crystal during crystal growth. This method has been the only method used for silicon carbide (SiC) thyristor fabrication. For example, the all-epitaxial layer approach has been utilized in both 6H-SiC and 4H-SiC to manufacture thyristor semiconductor devices.

SUMMARY OF THE INVENTION

According to one embodiment of the invention, a method is provided for forming one or more doped layers using ion-implantation in the fabrication of thyristors. These thyristors may be made, for example, from single crystalline silicon carbide. According to one aspect of the invention, one of the required layers is formed by introducing dopants after crystal growth as opposed to conventional methods which involve doping during crystal growth. Specifically, impurities may be introduced by using the technique of ion implantation.

According to one aspect of the invention, a method is provide for forming at least one doped layer of a thyristor comprising providing a semiconductor crystal, the crystal having a crystal structure and being used as at least one doped layer of a thyristor, and introducing impurities in the crystal structure after the crystal structure has been formed. According to one embodiment of the invention, the act of introducing impurities includes introducing impurities using ion implantation. According to one embodiment of the invention, the semiconductor crystal is made of a single crystalline carbide material. According to one embodiment of the invention, the act of introducing impurities using ion implantation includes implanting phosphorus donors using high energy implantation. According to one embodiment of the invention, the act of implanting phosphorus donors is performed at approximately 500 degrees C., and the crystal is annealed at approximately 1200 degrees C. in argon.

According to one embodiment of the invention, the semiconductor crystal is of a first conductivity type and the method includes defining a plurality of layers, the act of defining a plurality of layers comprises defining a first layer of semiconductor material of a first conductivity type, defining a second layer of semiconductor material of a second conductivity type in contact with the first layer, defining a third layer of semiconductor material of the second conductivity type in contact with the second layer, defining a fourth layer of semiconductor material of a first conductivity type in contact with the fourth layer, and defining a fifth layer of semiconductor material of a second conductivity type in contact with the fourth layer.

According to one embodiment of the invention, the method further comprises doping at least one of the plurality of layers by ion implantation. According to one embodiment of the invention, the first layer is made of N+ material. According to one embodiment of the invention, the second layer is made of P material. According to one embodiment of the invention, the third layer is made of P− material. According to one embodiment of the invention, the fourth layer is made of N material. According to one embodiment of the invention, the fifth layer is made of P+material. According to one embodiment of the invention, the fourth layer is formed using ion implantation.

According to another aspect of the invention, a thyristor is provided comprising at least one doped layer, the layer comprising a semiconductor crystal having a crystal structure, the at least one doped layer being formed by introducing impurities in the crystal structure after the crystal structure has been formed. According to one embodiment of the invention, the thyristor is manufactured from a single crystalline silicon carbide. According to one embodiment of the invention, impurities are introduced by ion implantation.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The invention is pointed out with particularity in the appended claims. The above and further advantages of this invention may be better understood by referring to the following description when taken in conjunction with the accompanying drawings in which similar reference numbers indicate the same or similar elements.

In the drawings.

DETAILED DESCRIPTION

Figure 1:
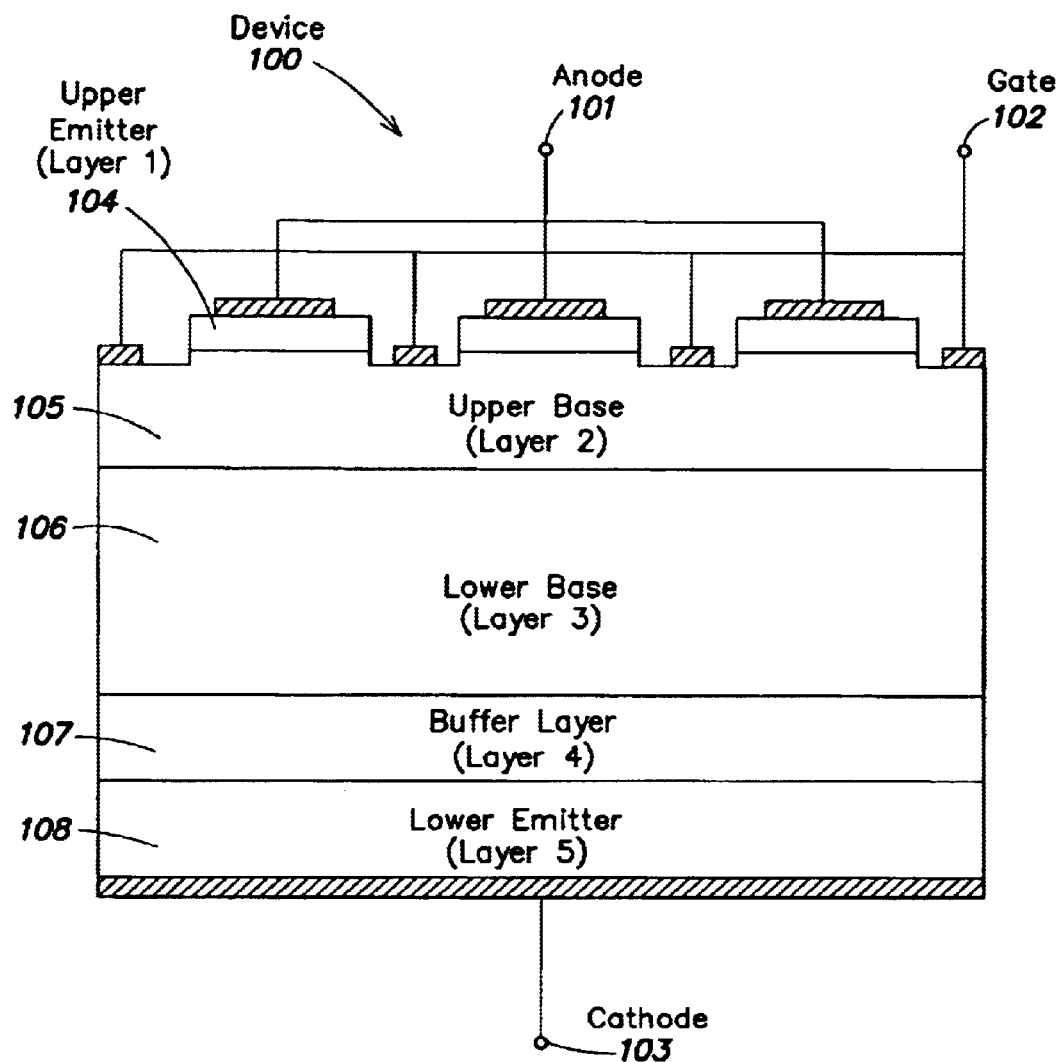
FIG. 1 is a cross section of a gate turn-off (GTO) thyristor in accordance with one embodiment of the invention.

FIG. 1 shows an example of a device cross-section showing all five layers of a thyristor device according to one embodiment of the invention wherein the upper base layer and/or the upper emitter are formed by ion-implantation. The thyristor may be, for example, a gate turn-off (GTO) thyristor. A GTO thyristor is a semiconductor device that can be turned on and off via a gate signal. The GTO thyristor can be turned on by a positive gate signal, but, unlike a conventional thyristor which can be turned off only at a zero crossing of current, a GTO thyristor can be turned off at any time by applying a negative voltage gate signal. Although GTO thyristors are shown by way of example, device formation processes disclosed herein may be used to form other semiconductor devices.

According to one embodiment of the invention, a new method is provided for forming one or more doped layers using ion-implantation in the fabrication of thyristor devices. For example, these thyristors may be made from single crystalline silicon carbide. According to one aspect of the invention, one of the required layers is formed by introducing dopants after crystal growth as opposed to conventional methods which involve doping during crystal growth. Specifically, impurities may be introduced by using the technique of ion implantation. It should be appreciated that other methods for introducing impurities may be used.

Referring to FIG. 1, the most feasible layers of the example GTO thyristor device 100 shown that may be ion-implanted include layers 1, 2, 4, and 5 defined as the upper emitter (layer 1), the upper base (layer 2), buffer layer (layer 4), and lower emitter (layer 5). It should be understood that other layers may be ion-implanted. However, due to the very low doping and large thickness of the lower base layer (layer 3), the lower base does not appear to be a good candidate for ion-implantation. Implantation of layers 4 and 5 is feasible if an appropriate substrate can be obtained (i.e., a substrate having an appropriate thickness and low enough doping). Such thickness and doping may be determined through experimentation for a particular semiconductor material. Thyristors constricted having implantation of the upper emitter (layer 1) are generally not successful due to the heavy dose and poor implant activation of the p-type dopant. The implanted upper base (layer 2) thyristors may also be performed. This structure is preferred because it has the advantage of having a lower dose and the corresponding reduction of crystal damage at lower dose and better activation of the n-type implant.

Ion implantation may be performed to one or more layers as is known in the art. Ion implantation and other background information regarding semiconductor manufacturing are described in more detail in the books entitled "Silicon Processing for the VLSI Era, Volume 1-Processing Technology" by S. Wolf and R. N. Tauber, Second Edition, Lattis Press, Sunset Beach, Calif., 2000, and "Silicon Processing for the VLSI Era, Volume 2-Process Integration" by S. Wolf, Lattis Press, Sunset Beach, Calif., 1990. All references cited herein are incorporated by reference.

As shown in FIG. 1, a typical GTO thyristor cross section includes a substrate (lower emitter 108, layer 5). This substrate may be, for example, a material of a first conductivity type (for example, N material) which may be doped during bulk growth. For instance, lower emitter 108 may be formed of N+material. As discussed, the device may have one or more layers. A buffer layer 107 (layer 4) is formed and is in contact with the substrate (lower emitter 108). Buffer layer 107 may be, for example, epitaxially grown and doped in situ and may be formed of a second conductivity type (for example, P material).

A lower base layer 106 (layer 3) is formed and is in contact with buffer layer 107. Lower base layer 106 may also be epitaxially grown and doped in situ and may be formed of a material of a second conductivity type (for example, P material). For instance, lower base layer 106 may be formed of P− material. Upper base layer 105 (layer 2) may be formed and may be in contact with the lower base layer 106. According to one embodiment of the invention, upper base layer 105 may be epitaxially grown and doped by ion implantation. Upper base layer 105 may be formed of a material of a first conductivity type (for example, N material). Upper emitter 104 (layer 1) may be formed and in contact with upper base layer 105. Upper emitter 104 may be epitaxially grown and doped in situ and may be formed of a material of a second conductivity type (for example, P material). For instance, upper emitter 104 may be formed of P+ material. It should be appreciated that other material configurations may be used.

Upper emitter 104 layers are connected electrically together to form anode 101 of thyristor device 100. Upper base layer 105 functions as the gate of device 100, and connections may be interspersed between upper emitter layers 104. Lower emitter 108 functions as the cathode 103 of device 100.

Figure 2A:
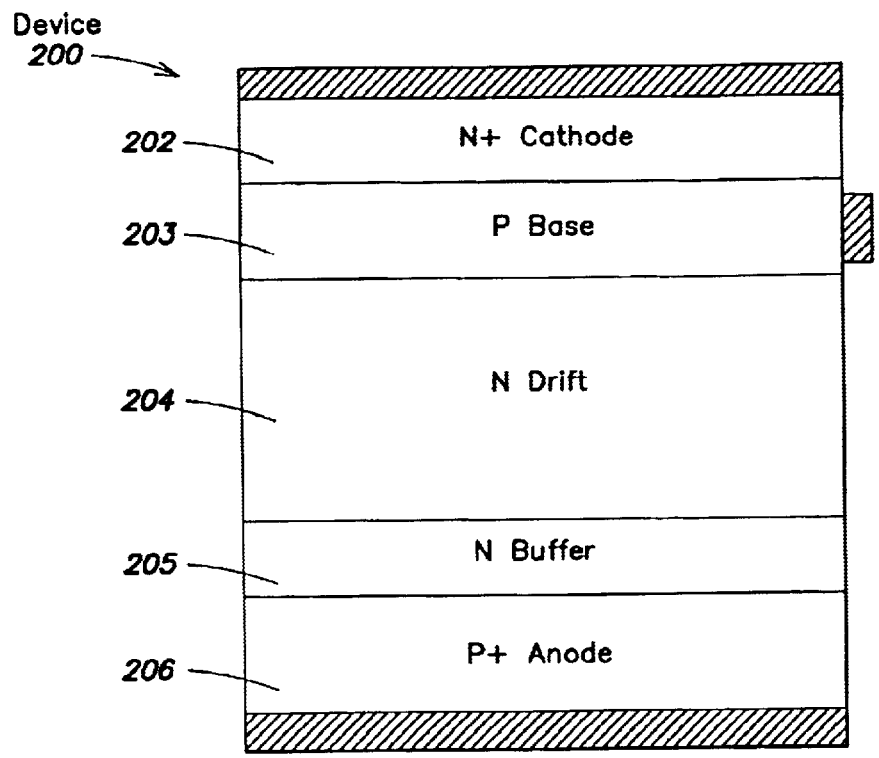
FIGS. 2A–2B are block diagrams of GTO thyristor structures having P+ and N+ substrates according to various embodiments of the invention.
Figure 2B:
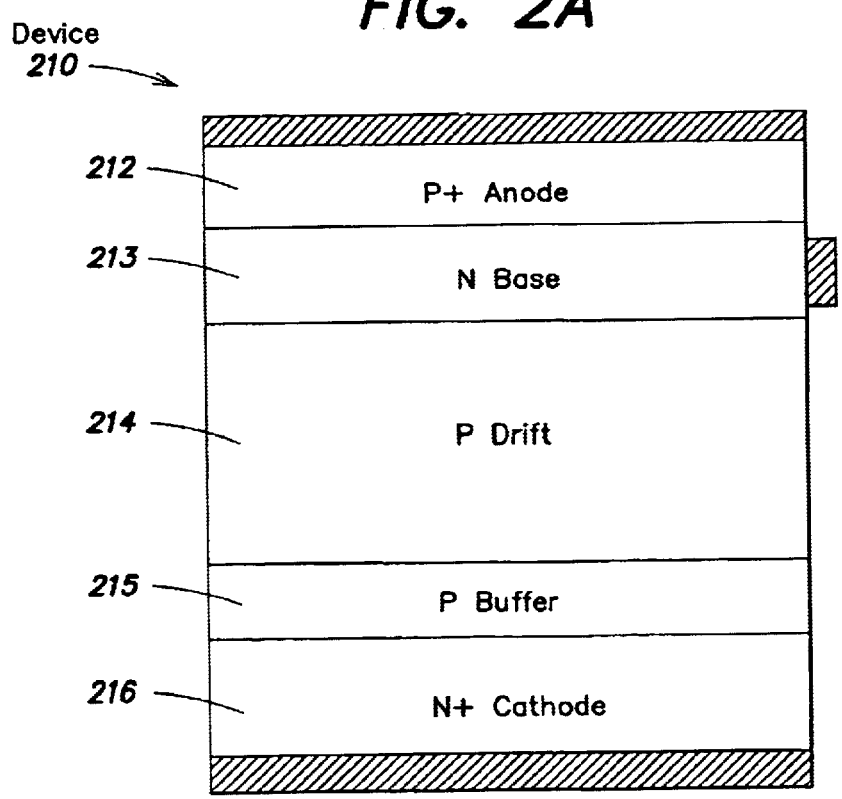

A preferred substrate for use as a GTO thyristor is the N+ substrate as shown in FIG. 2B. FIG. 2A shows a detail of a complementary P+ substrate thyristor according to another embodiment of the invention. More particularly, FIG. 2A shows a p-base GTO thyristor device 200 having an N+ cathode 202 in contact with a P base 203. P base 203 is formed above an N drift layer 204, which in turn is formed above an N buffer layer 205. N buffer 205 is in contact with a P+anode 206 which may be formed, for example, from a P+ substrate. As discussed above, layers 202–205 may be formed epitaxially, and one or more of these layers may be formed by ion implantation.

FIG. 2B shows an n-base GTO thyristor in accordance with another embodiment of the invention. More particularly, FIG. 2B shows an n-base thyristor device 210 having a P+ anode 212 in contact with an N base 213. N base 213 is formed above a P drift layer 214, which is in turn formed above a P buffer layer 215. P buffer layer 215 is in contact with an N+ cathode 216, which may be formed, for example, from an N+ substrate. As discussed above, layers 212–215 may be formed epitaxially, and one or more of these layers may be formed by ion implantation.

Figure 3A:
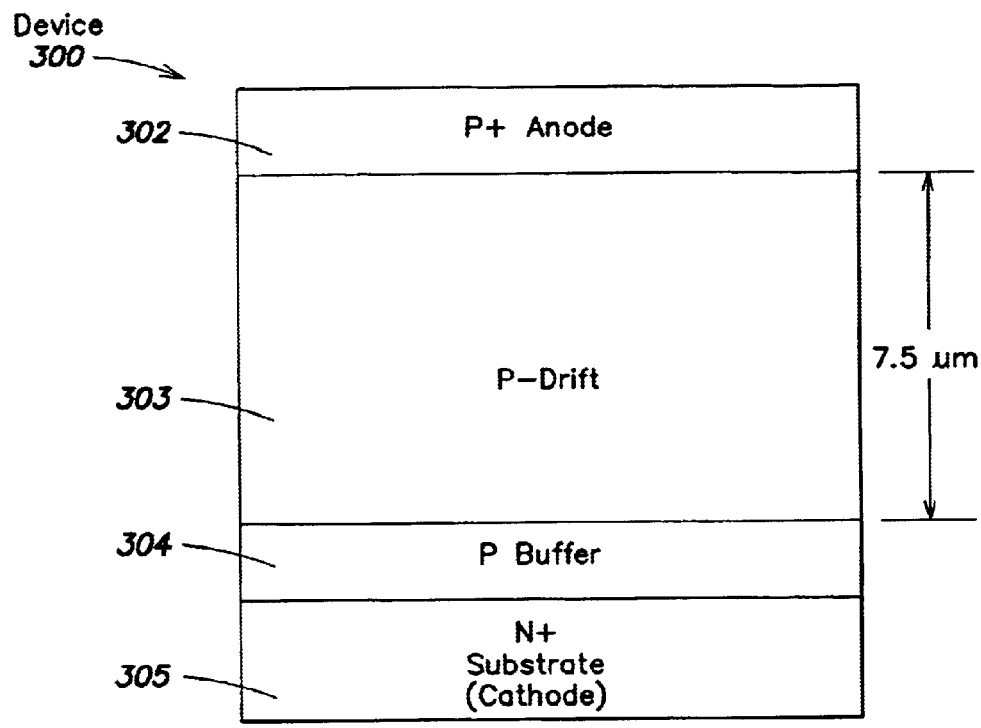
FIGS. 3A–3B are block diagrams showing ion implantation that forms at least one layer of an n-base GTO thyristor.
Figure 3B:
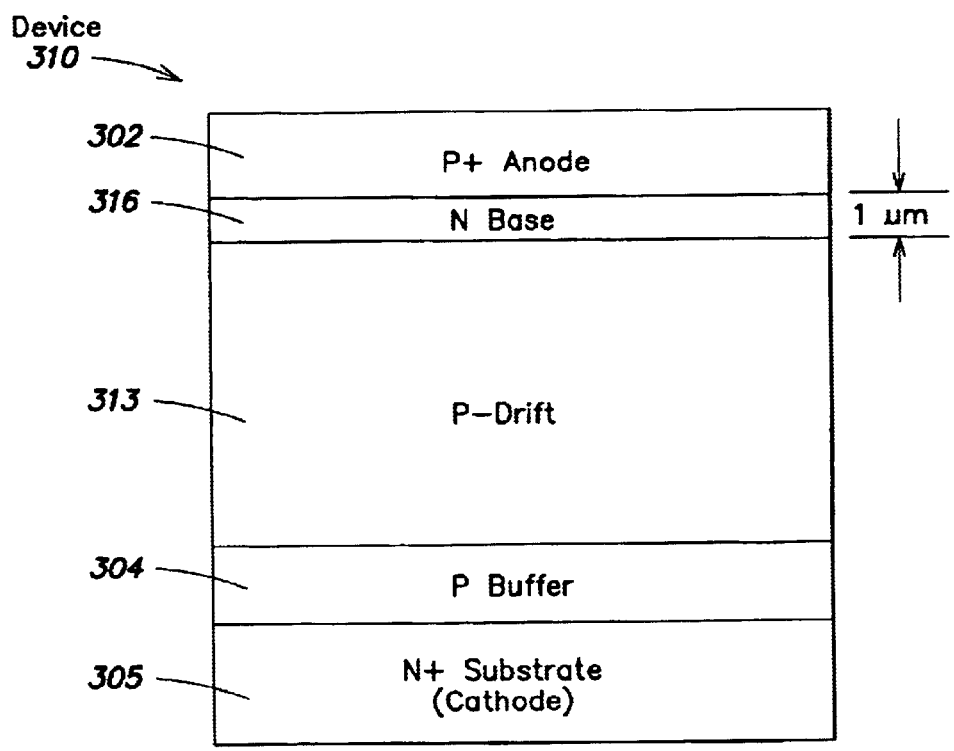

A thyristor according to one embodiment of the invention may be a 4H-SiC GTO thyristor made with epitaxial and implanted n-base layers. FIGS. 3A–3B show an n-base device 300 which is used to produce an implanted n-base device 310 using ion implantation. An implanted n-base approach allows greater flexibility in the n-base doping profile compared to the conventional all-epitaxial approach. However, it should be appreciated that any method for performing ion implantation may be used. For example, the n-base may be implanted with phosphorous donors using high energy ion implantation. Other implantation methods may be used.

More particularly, device 300 includes a P+ anode 302 formed above a P− drift layer 303. For example, this P− drift layer may be 7.5 μm thick before ion implantation. Device 300 also includes a P buffer layer 304 formed in contact with the P− drift layer 303 and an N+ substrate layer. The N+ substrate is used as a cathode of the thyristor.

As is shown in FIG. 3B, ion implantation may be used to achieve a 1 μm thick n-type layer 316 with a doping concentration of $4 \times 10^{17}$ cm$^{-3}$. In effect, by performing ion implantation, the first 1 micron of the lightly doped p-type drift layer 303 ($5 \times 10^{15}$ cm$^{-3}$, for example) is converted into an n-type layer 316 as shown in FIGS. 3A and 3B. Thus, a novel implanted n-base GTO thyristor device 310 may be produced. For example, this GTO thyristor 310 may be implemented using silicon carbide (SiC). Ion implantation may be carried out at a temperature of approximately 500 degrees C. and may be annealed at 1200 degrees C. in argon.

Figure 4:
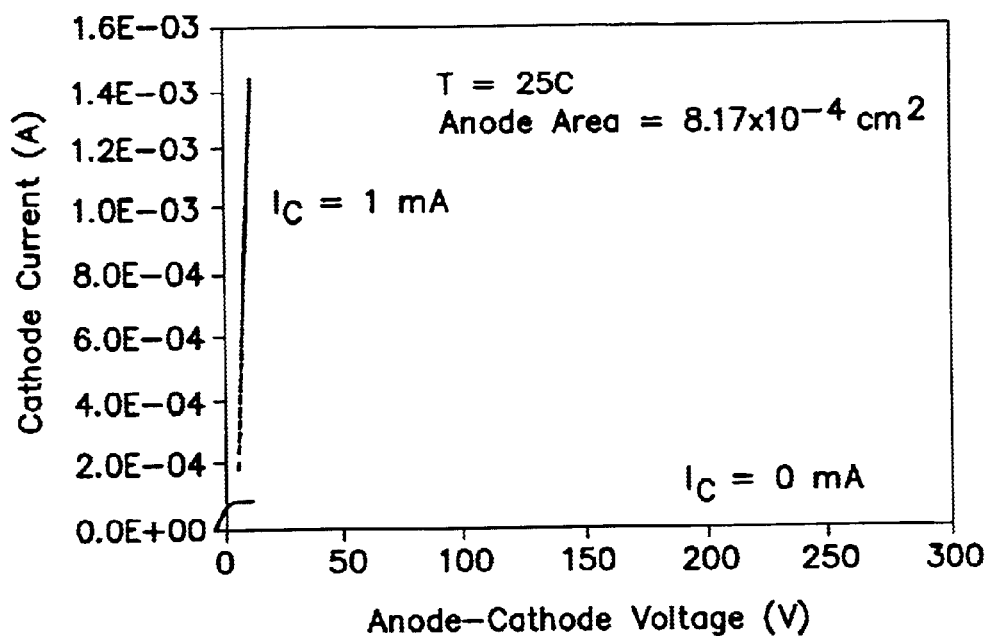
FIG. 4 is a chart showing forward on-state and blocking characteristics of the GTO thyristor of FIG. 3B.

Forwarding characteristics of an implanted n-base GTO thyristor 300 of FIG. 3B are shown in FIG. 4 in which the blocking voltage is 250V at room temperature and the on-state voltage is 8.7 V at 0.8 mA (1A/cm$^2$). The on-state voltage increases slightly with temperature ($V_{AK}$=9.2 V at 75 degrees C.). The gate trigger current is 1 mA at room temperature and increases to 10 mA at 75 degrees C.

Figure 5:
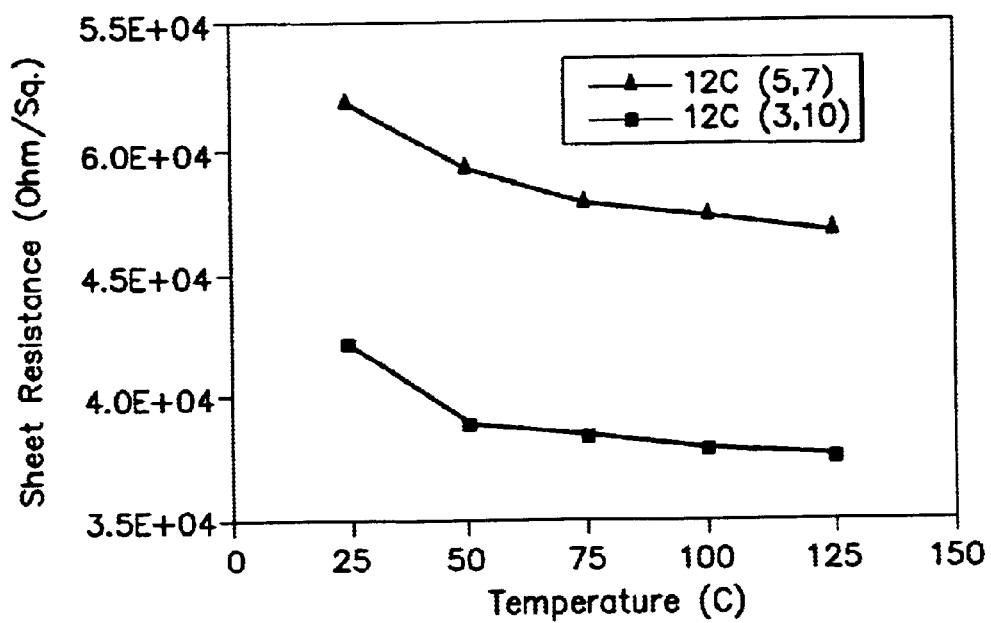
FIG. 5 is a chart showing sheet resistance of an n-base of the GTO thyristor of FIG. 3B versus temperature.

Electrical test structures may be fabricated on the same wafer to monitor specific contact resistance and the n-base sheet resistance. Contact resistance measurements shown, for example, in FIG. 5 yield 1.5×10$^{-4}$ and 1.3×10$^{-2}$ Ω cm$^2$ respectively for the n and p type contacts. The n-base sheet resistance may be shown, as in FIG. 5 for example, as a function of temperature at two different locations on the wafer. For instance, temperature may be measured at two different locations, and these locations may be, for example, locations where a higher than expected sheet resistance is found, due to implant damage or incomplete substitutional incorporation of phosphorus. At 25 degrees C., the expected sheet resistance is 1.2 kΩ/Sq. assuming an electron hole mobility of 350 cm$^2$/Vs and 50 percent donor ionization whereas measured values are approximately 40 times higher in the range of 40–50 kΩ/Sq. at room temperature.

Having thus described various illustrative embodiments of the invention, additional modifications and improvements will readily occur to those skilled in the art and are intended to be within the scope of the invention. Accordingly, the foregoing description and drawings are by way of example only, and they are not intended to be limiting. Thus, the breadth and scope of the present invention are not limited by any of the above-described embodiments, but are defined only in accordance with the following claims and their equivalents.

What is claimed is:

1. A method of forming at least one doped layer of a thyristor comprising:
    providing a semiconductor crystal of a single crystalline carbide material, the semiconductor crystal having a crystal structure and forming a gate turn-off thyristor device having a plurality of layers including a layer that forms an upper base of the thyristor device
    introducing impurities in the crystal structure to form the upper base layer after the crystal structure has been formed.

2. The method according to claim 1, wherein the act of introducing impurities includes introducing impurities using ion implantation.

3. The method according to claim 2, wherein the act of introducing impurities using ion implantation includes implanting phosphorus donors using high energy implantation.

4. The method according to claim 3, wherein the act of implanting phosphorus donors is performed at approximately 500 degrees C., and the crystal is annealed at approximately 1200 degree C. in argon.

5. The method according to claim 1, wherein the semiconductor crystal is of a first conductivity type and the method includes defining the plurality of layers of the thyristor, the act of defining the plurality of layers comprises:
    defining a first layer of semiconductor material of a first conductivity type;
    defining a second layer of semiconductor material of a second conductivity type in contact with the first layer;
    defining a third layer of semiconductor material of the second conductivity type in contact with the second layer;
    defining a fourth layer of semiconductor material of a first conductivity type in contact with the fourth layer; and
    defining a fifth layer of semiconductor material of a second conductivity type in contact with the fourth layer.

6. The method according to claim 5, further comprising doping at least one of the plurality of layers by ion implantation.

7. The method according to claim 5, wherein the first layer is made of N+ material.

8. The method according to claim 5, wherein the second layer is made of P material.

9. The method according to claim 5, wherein the third layer is made of P– material.

10. The method according to claim 5, wherein the fourth layer is made of N material and forms the upper base layer of the thyristor device.

11. The method according to claim 5, wherein the fifth layer is made of P+ material.

12. The method according to claim 10, wherein the fourth layer is formed using ion implantation.

13. The method according to claim 1, further comprising an act of forming the plurality of layers of the thyristor device except the upper base layer by epitaxial growth.

14. The method according to claim 1, wherein the upper base layer is formed in a p-type layer by acts of performing ion implementation of an upper portion of the p-type layer and annealing the upper portion of the p-type layer.

* * * * *

UNITED STATES PATENT AND TRADEMARK OFFICE
CERTIFICATE OF CORRECTION

PATENT NO.     : 6,787,816 B1                                               Page 1 of 1
DATED          : September 7, 2004
INVENTOR(S)    : Tatsing P. Chow et al.

It is certified that error appears in the above-identified patent and that said Letters Patent is hereby corrected as shown below:

<u>Column 1</u>,
After line 12, before "BACKGROUND OF THE INVENTION" add

-- FEDERALLY SPONSORED RESEARCH

This invention was made with Government support under Navy/ONR contract number N 00014-95-1-1-1302. The Government may have certain rights to this invention. --.

Signed and Sealed this

Eleventh Day of October, 2005

JON W. DUDAS
*Director of the United States Patent and Trademark Office*